United States Patent [19]
Noguchi et al.

[11] Patent Number: 5,959,846
[45] Date of Patent: Sep. 28, 1999

[54] MODULAR SURFACE MOUNT CIRCUIT DEVICE AND A MANUFACTURING METHOD THEREOF

[75] Inventors: Kathuhiko Noguchi; Masashi Miyashita; Yosio Murano, all of Yamanashi-ken, Japan

[73] Assignee: Citizen Electronics, Co., Ltd., Fujiyoshida, Japan

[21] Appl. No.: 08/997,485

[22] Filed: Dec. 23, 1997

[51] Int. Cl.⁶ .................................................. H05K 7/02
[52] U.S. Cl. ........................... 361/782; 361/762; 361/748; 361/763; 361/764; 361/771; 361/783; 361/807; 361/809; 361/811; 361/812; 257/690; 257/704; 257/736; 257/774; 257/782; 257/784; 257/783; 336/200; 333/238; 333/246; 333/204
[58] Field of Search .................................. 361/782, 762, 361/748, 763, 764, 760, 772, 771, 783, 807, 809, 811, 812; 257/690, 691, 704, 735, 736, 773, 774, 782, 784, 783; 336/200; 333/238, 246, 204; 174/524

[56] References Cited

U.S. PATENT DOCUMENTS

| | | | |
|---|---|---|---|
| 4,225,900 | 9/1980 | Ciccio et al. | 361/739 |
| 5,083,236 | 1/1992 | Chason et al. | 361/762 |
| 5,191,699 | 3/1993 | Ganslmeier et al. | 29/602.1 |
| 5,220,488 | 6/1993 | Denes | 361/749 |
| 5,430,613 | 7/1995 | Hastings et al. | 361/760 |

FOREIGN PATENT DOCUMENTS

| | | |
|---|---|---|
| 0473875 | 3/1992 | European Pat. Off. . |
| 0379404 | 7/1992 | European Pat. Off. . |
| 0555994 | 8/1993 | European Pat. Off. . |
| 61-204915 | 9/1986 | Japan . |
| 4030439 | 2/1992 | Japan . |

*Primary Examiner*—Leo P. Picard
*Assistant Examiner*—David Foster
*Attorney, Agent, or Firm*—Dennison, Meserole, Scheiner & Schultz

[57] ABSTRACT

First and second electrically insulating substrates are joined with each other at respective joining faces thereof. Each of the first and second insulating substrates has an annular groove at the joining face, and a plurality of through holes along outer and inner peripheries of the annular groove. An annular core is mounted in the annular groove. A cylindrical connection is formed in each through hole, and a radial connection is formed on an outer surface of each insulating substrate so as to connect opposite cylindrical connections. A toroidal coil is formed by serially connecting cylindrical connections and radial connections. An IC chip is mounted on the outer surface of the first insulating substrate, and connected to the toroidal coil and electronic part. The toroidal coil and the electronic part are coated with an electrically insulating material.

11 Claims, 11 Drawing Sheets

MODULAR SURFACE MOUNT CIRCUIT DEVICE AND A MANUFACTURING METHOD THEREOF

BACKGROUND OF THE INVENTION

The present invention relates to a circuit device for a portable or desktop electronic equipment, and more particularly to a modular surface mount device (SMD) employed with an inductor.

Recently, electronic equipments, in particular portable electronic equipments are demanded to be miniaturized and lightened in weight as well as to have high efficiency and multiple function. The portable electronic equipment uses a battery for driving a circuit in the equipment. The electric current for driving the circuit is direct current and/or alternating current. The voltage for driving the circuit is different with the type of the electronic equipment. Therefore, a small circuit device which can be arranged to supply various voltage is demanded.

The portable electronic equipment mostly has an electroluminescent (EL) cell so as to clearly indicate keys at night. The EL cell is driven by alternating current. Therefore, direct current of the battery is converted into alternating current by an inverter and boosted for driving the EL cell.

On the other hand, in the portable electronic equipment, particularly in a portable office automation such as a notebook, direct current of the battery is directly converted by a dc-to-dc converter, or alternating current is once converted into direct current and converted by a dc-to-dc converter to a direct current voltage for driving the equipment.

Figure 18:
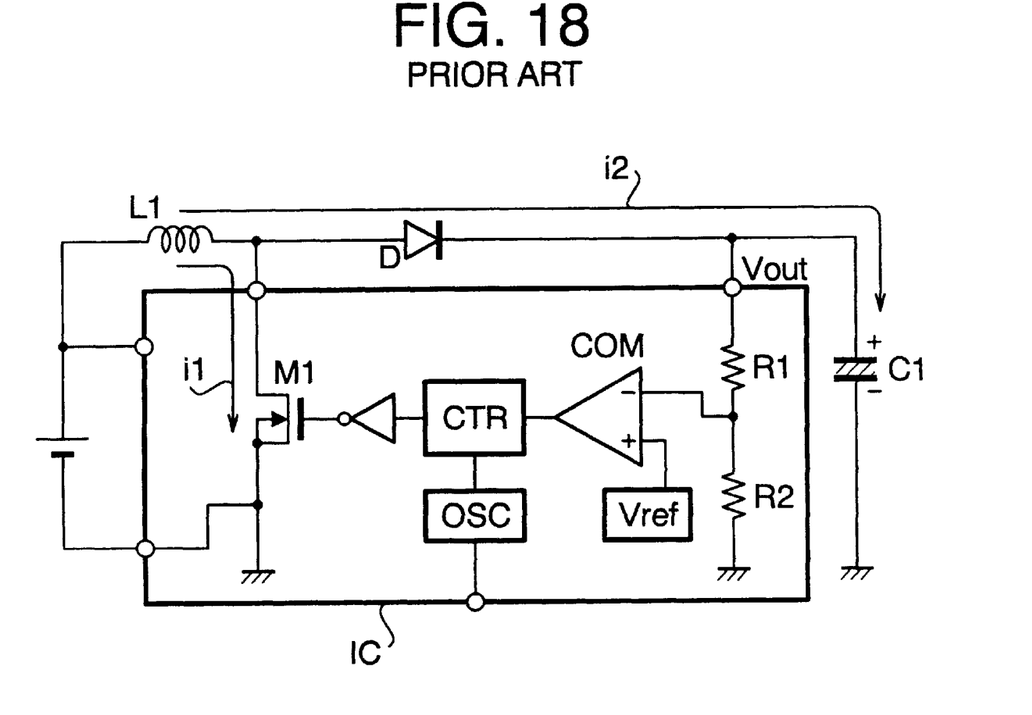
FIG. 18 is a block diagram showing an integrated circuit for a conventional dc-to-dc converter.

FIG. 18 shows an integrated circuit (IC) for a conventional dc-to-dc converter employed with a coil. The integrated circuit is an example of a voltage step-up type for obtaining a high output voltage from a low input voltage (battery voltage).

An IC-chip IC comprises a reference voltage circuit Vref, a voltage divider having resistors R1 and R2, a comparator COM, an oscillator OSC, a control circuit CTR (such as PFM=Pulse Frequency Modulation or PWM=Pulse Width Modulation), and a transistor M1.

When the transistor M1 is turned on, energy of a battery V is stored in a coil L1. The stored energy is applied to a capacitor Cl through a diode D and stored therein, thereby obtaining a desired output voltage Vout.

An output voltage of the voltage divider and a reference voltage of the reference voltage circuit Vref are applied to the comparator COM. The input voltages are compared in the comparator COM, and a comparison signal is applied to the controller CTR. The controller CTR produces a control signal which is applied to the transistor M1. The transistor M1 is controlled by the control signal to change an on-off interval (pulse frequency modulation) or an on-off time (pulse width modulation) so that the charging current i1 to the coil L1 and the discharging current i2 from the coil L1 are controlled for obtaining a desired direct current voltage which is higher than the input voltage V. The obtained direct current is applied to a load such as a motor or a printer.

As shown in FIG. 18, the dc-to-dc converter has, other than the IC-chip IC, an external part including the coil L1, diode D and capacitor C1. If the IC-chip IC includes the diode D therein, the external part has only the coil L1 and the capacitor C1.

Also in the case of voltage step-down type for obtaining a low output voltage from a high input voltage (battery voltage), the structure of the integrated circuit is approximately the same as that of the above mentioned circuit.

In order to reduce the thickness of electronic part employed in the portable electronic equipment such as a portable telephone, camera or notebook, it is desirable to compose it by the surface mount technology. On the other hand, an inductor of a thin chip type has small size and high accuracy, compared with an ordinary coil. Japanese Patent Application Laid-Open 5-82349 discloses the thin chip inductor.

Figure 19:
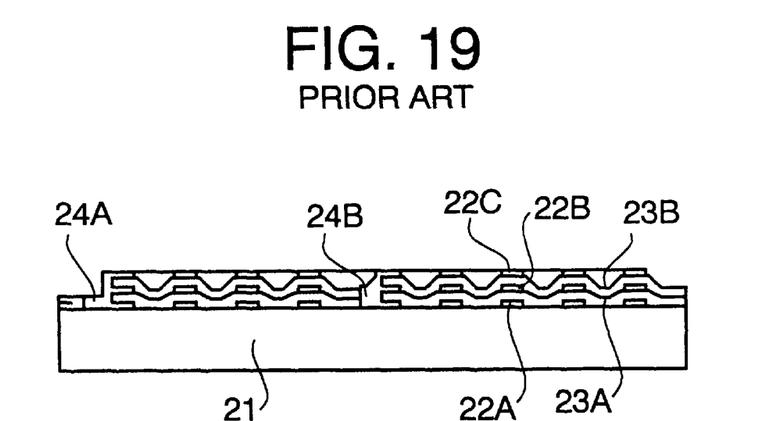
FIG. 19 is a sectional view showing a conventional thin chip inductor.
Figure 20:
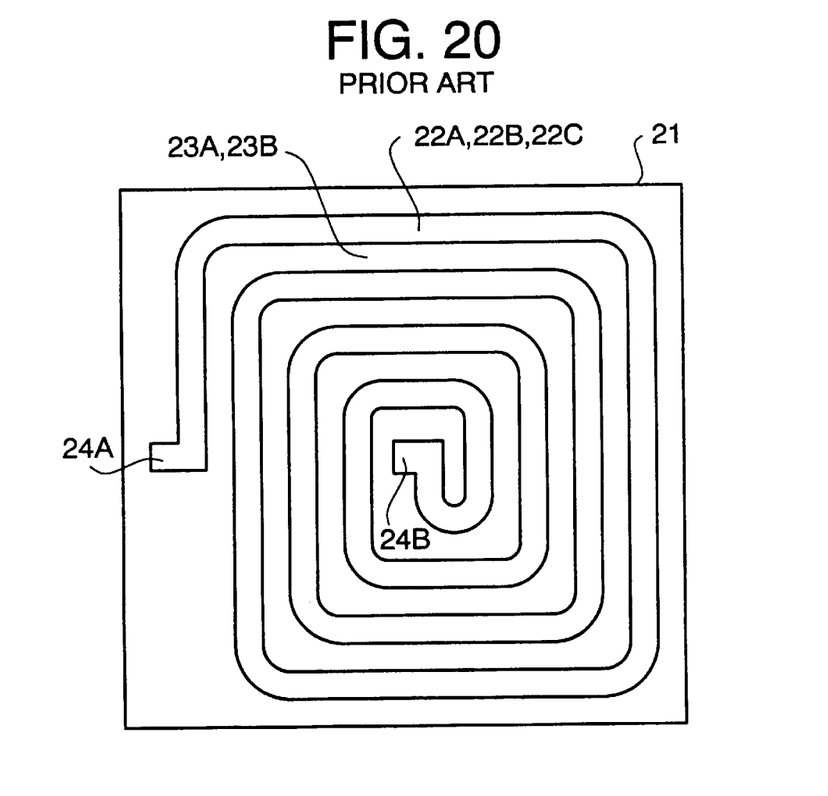
FIG. 20 is a plan view showing the thin chip inductor of FIG. 20.

FIGS. 19 and 20 show the thin chip inductor. The thin chip inductor comprises three planar swirl coils 22A, 22B and 22C mounted on an insulating substrate 21, interposing coating layers 23A and 23B there-between. The insulating substrate 21 is made of ceramic wafer having a low dielectric constant. Each of the planar swirl coils 22A, 22B and 22C is mainly made of copper thin film having low resistance. Each of the coating layers 23A and 23B is made of heat resistance resin having a low dielectric constant. Outer end portions 24A of three coils are electrically connected to each other. Inner end portions 24B of three coils are also electrically connected to each other.

The thin chip inductor comprising three planer swirl coils has a small size and high efficiency. Since the inductor is sealed with the resin of low dielectric constant, it is superior to resistance of environmental characteristic. Therefore, the inductor is proper to a communication equipment used outdoors or mounted in a car in which vibration or temperature largely changes. However, since the number of windings of the swirl coil can not be increased, inductance of the coil can not be increased.

Figure 21:
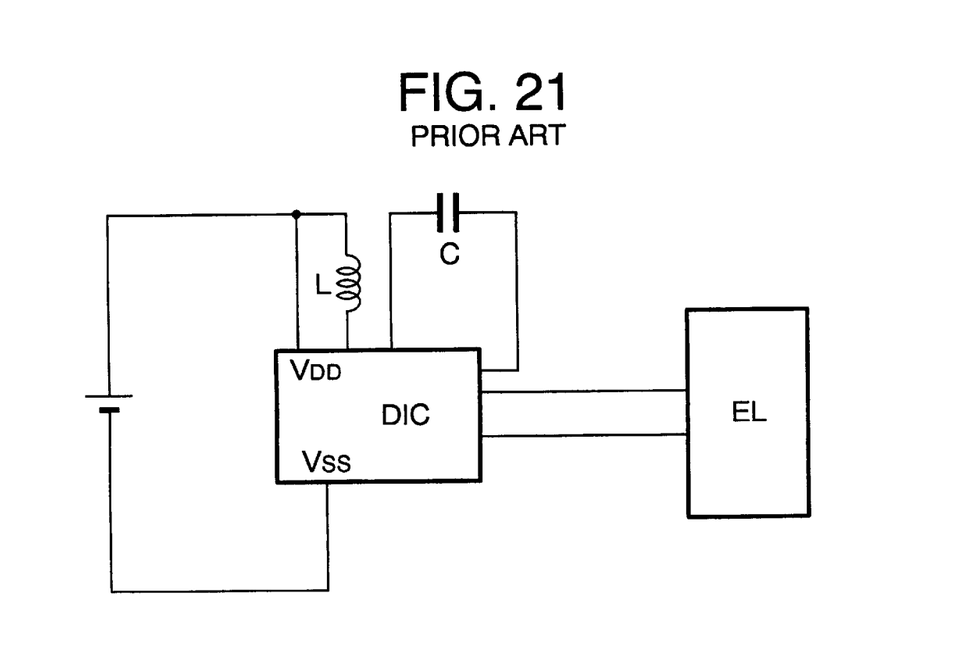
FIG. 21 is a block diagram showing a conventional voltage step-up circuit for driving an EL cell.

FIG. 21 shows a conventional voltage step-up circuit employed with a coil for driving an EL cell. The circuit comprises an EL cell EL, a drive circuit DIC for driving the EL cell EL, a coil L and a capacitor C. The circuit is formed by combining the individual elements.

Basically, the EL cell driven by alternating current comprises a suitable phosphor layer placed between sheet-metal electrodes, inserted into insulating layers. The alternating current is applied to the electrodes from the drive circuit DIC. When the intensity of electric field of the phosphor layer exceeds a predetermined value, atoms in the phosphor layer is energized to emit light which has an intrinsic wavelength of the atom. The EL cell emits the light if alternating current voltage or voltage of rectangular wave between 10V and 100V is applied to the electrodes. Furthermore, it is known that luminous efficacy of the EL cell differs in accordance with a difference of working process of material of the cell, and voltage and oscillation frequency applied to the electrodes.

The most significant feature of the EL cell is that the thickness is extremely thin and light. Therefore, the EL cell is used for providing back lighting for LCDs. In the portable equipments such as portable telephone and camera which are mainly used outdoors, it is necessary to provide a voltage step-up circuit only for the EL cell. However, if the aforementioned circuit comprising individual parts is used, the portable equipment is prevented from reducing the thickness, weight and size.

SUMMARY OF THE INVENTION

An object of the present invention is to provide a modular surface mount circuit device in which IC chip, coil, capacitor and diode are packaged, whereby the device can be reduced in size, weight, and a manufacturing cost.

According to the present invention, there is provided a modular surface mount circuit device comprising a junction unit including first and second electrically insulating substrates which are joined with each other at respective joining faces thereof, at least one of the first and second insulating substrates having an annular groove at the joining face, each of the first and second insulating substrates having a plurality of through holes along outer and inner peripheries of the annular groove, an annular core made of magnetic material mounted in the annular groove, a cylindrical connection formed in each of the through holes, a radial connection formed on an outer surface of each of the first and second insulating substrates so as to connect opposite cylindrical connections, a toroidal coil formed by serially connecting cylindrical connections and radial connections, at least one electronic part mounted on the outer surface of either of the first and second insulating substrates, patterns mounted on the part mounted surface for connecting the toroidal coil and the electronic part, and an electrically insulating material coating the toroidal coil and the electronic part.

The annular groove may be formed in the joining face of each of the insulating substrates. A pair of terminal electrodes are formed on opposite end portions of the junction unit, and both ends of the toroidal coil are electrically connected to the terminal electrodes, respectively. The second insulating substrate is made of insulating film. In such a case, the first insulating substrate has a recess at a central portion in the toroidal coil, and the electronic part is mounted in the recess.

The present invention further provides a method for manufacturing a plurality of modular surface mount circuit devices, the steps comprising providing first and second electrically insulating planar substrates, each having an outer surface and a joining face, and having a plurality of units defined by a plurality of crossing lines, at least one of the substrates having an annular groove in each of the units arranged in matrix on the joining face, and each of the substrates having a plurality of through holes formed along outer and inner peripheries of each of the annular grooves, forming a cylindrical connection in each of the through holes of each of the substrates, forming a radial connection on the outer surface of each of the substrates so as to connect opposite cylindrical connections, mounting an annular core made of magnetic material in each of the annular grooves, joining the first and second substrates at the joining faces, electrically and serially connecting the cylindrical connections and radial connections at each of the units so as to form a toroidal coil, mounting at least one electronic part on the outer surface of either of the first and second substrates at each unit, electrically connecting the toroidal coil and the electronic part with each other at each unit, coating the toroidal coil and the electronic part with an electrically insulating material, and cutting the first and second substrates along the crossing lines to provide an individual circuit device.

Each of the first and second substrates has a plurality of elongated through holes formed along parallel lines between arrays of units, and forming a terminal electrode along each of the elongated through holes, opposite terminal electrodes are connected to both ends of the toroidal coil.

These and other objects and features of the present invention will become more apparent from the following detailed description with reference to the accompanying drawings.

DETAILED DESCRIPTION OF THE PREFERRED EMBODIMENTS

Figure 1:
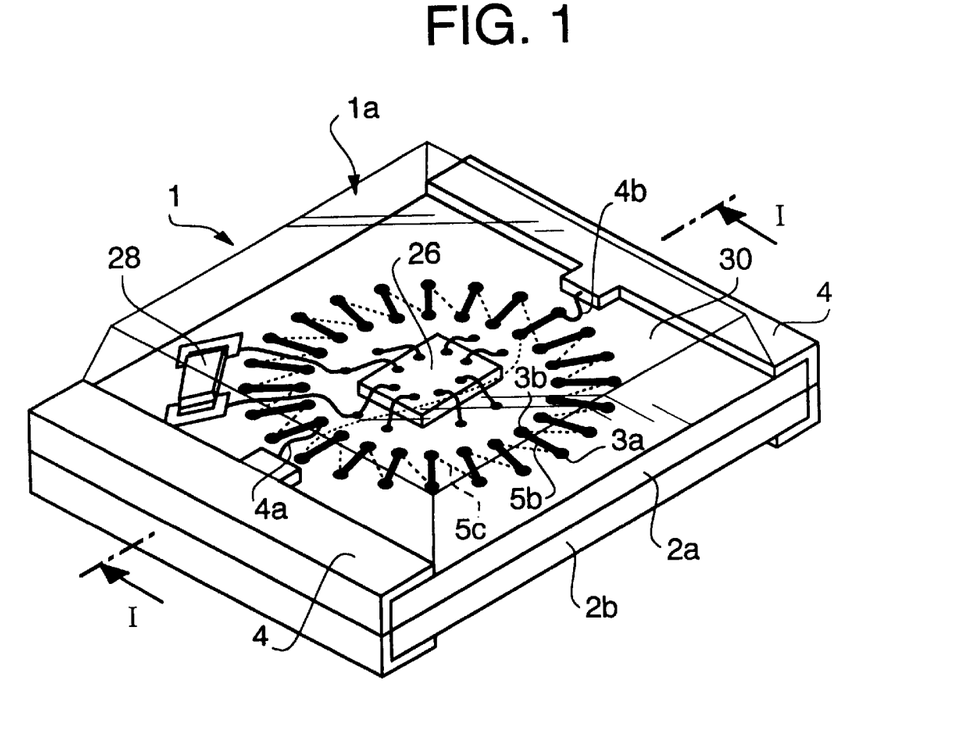
FIG. 1 is a perspective view showing a modular surface mount circuit device for driving an electroluminescent cell according to the present invention.

Referring to FIG. 1, a modular surface mount circuit device 1 for driving an EL cell according to the present invention comprises first and second electrically insulating substrates 2a and 2b each of which has a rectangular shape made of polycarbonate (PCB) or ceramic substrate, an IC 26 mounted on the first insulating substrate 2a for stepping up voltage, and a transparent sealing resin 30.

Figure 3:
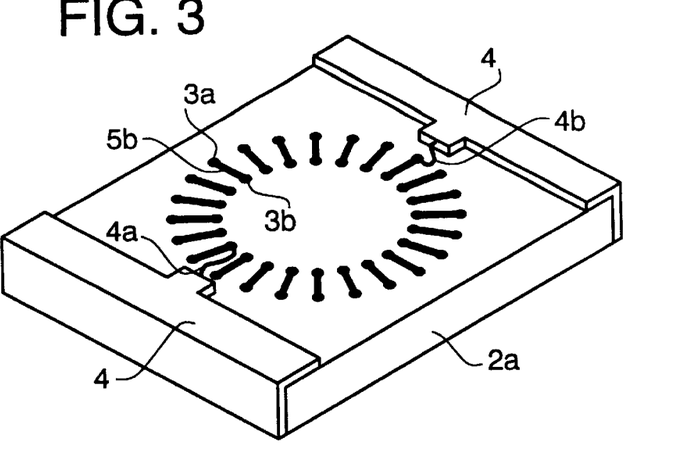
FIG. 3 is a perspective view showing a first insulating substrate of the modular surface mount circuit device.
Figure 4:
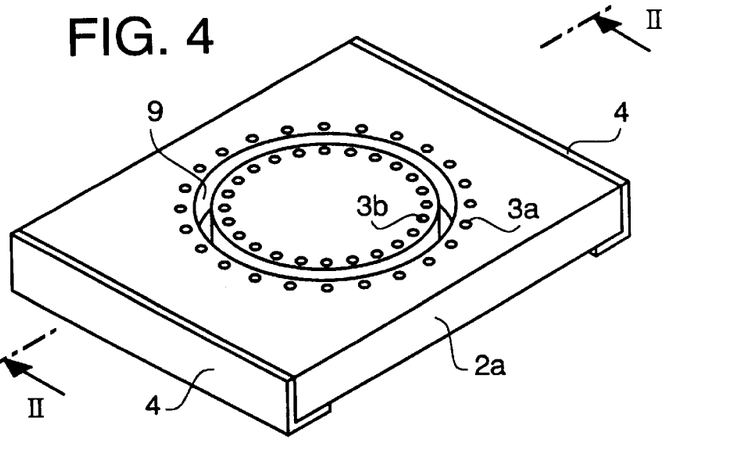
FIG. 4 is a perspective view showing the first insulating substrate viewed from a rear side.
Figure 5:
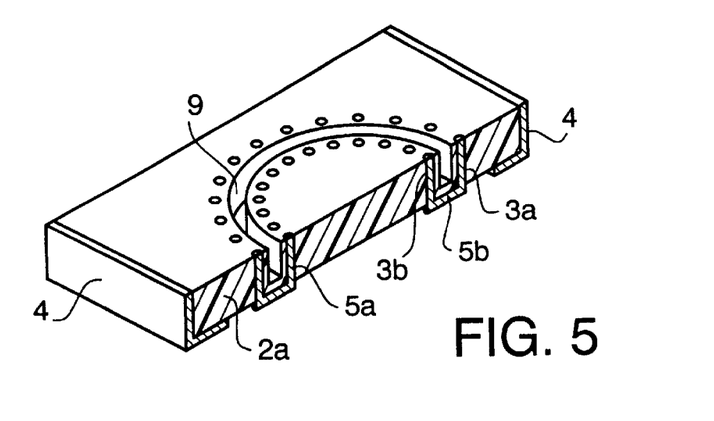
FIG. 5 is a sectional perspective view of the first insulating substrate taken along a line II—II of FIG. 4.

FIGS. 3 and 4 show the first insulating substrate 2a. The first insulating substrate 2a has an annular groove 9 having a U-shape in section (FIG. 5), formed on a joining face in a central portion thereof for containing a core. Around the annular groove 9, a plurality of through holes 3a and 3b are formed along outer and inner peripheries by working process such as pressing or drilling. A pair of through holes 3a and 3b are opposite disposed to correspond to each other.

Figure 6:
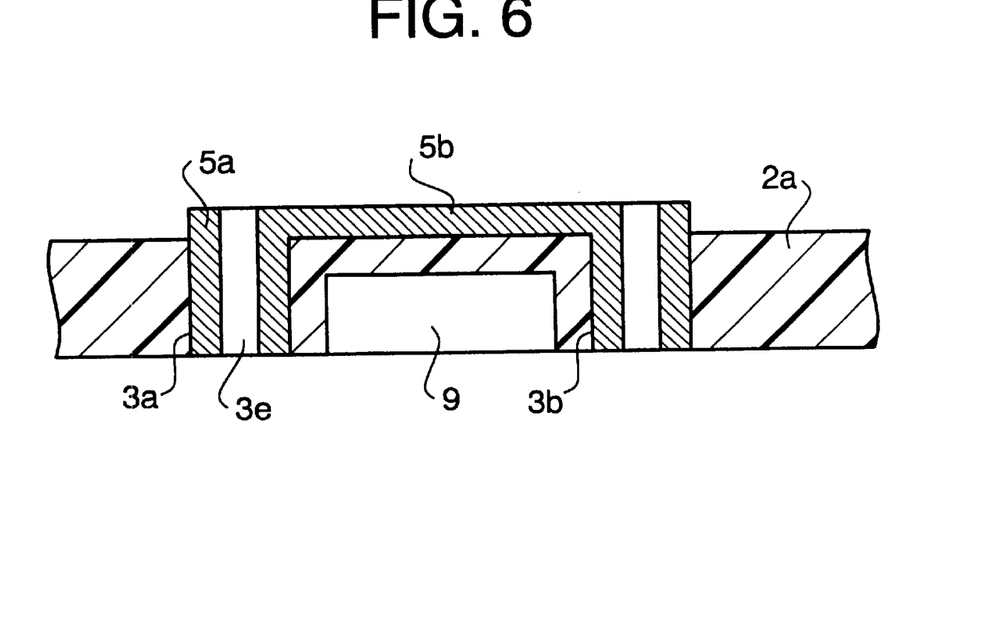
FIG. 6 is an enlarged sectional view showing through holes of the first insulating substrate.

The outer surface and opposite sides of the first insulating substrate 2a is plated with copper, including inner wall portions of the through holes 3a and 3b. Etching is applied on the plating layer so that a cylindrical connection 5a is formed on the inside wall of each of through holes 3a and 3b as shown in FIG. 6, a radial connection 5b is formed between the cylindrical connections 5a of opposite through holes 3a and 3b, and opposite terminal electrodes 4 are formed on opposite end portions and opposite sides. Thus, electrical connection is formed between the outer surface and the joining face of the insulating substrate 2a through the cylindrical connection 5a on the inside wall of each through hole. As shown in FIG. 6, each of the through holes 3a and 3b is plated so as to remain a through hole 3e in the center thereof.

Figure 7:
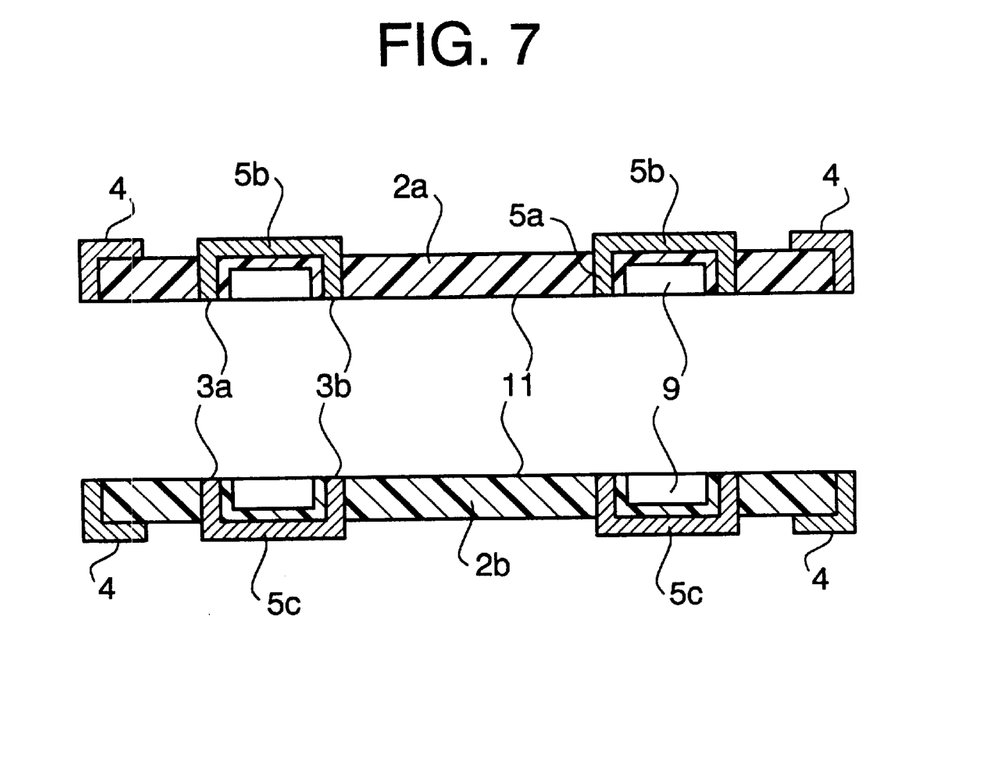
FIG. 7 is a developed sectional view showing first and second insulating substrates.

Referring to FIG. 7, the second insulating substrate 2b is the same as the first insulating substrate 2a in configuration and structure. Therefore, parts which are the same as those of the first substrate 2a are identified with the same reference numerals of FIG. 5, and the descriptions thereof are omitted. However, in the second insulating substrate 2b, a radial connection 5c is formed to connect adjacent cylindrical connection of diagonal through holes 3a and 3b such that a zigzag pattern is formed as viewed in plan as shown in FIG. 1 when both substrates 2a and 2b are joined.

Furthermore, on the outer surface of the first substrate 2a, a die pattern for mounting the IC 26, and a connecting electrode connected to the die pattern are provided, which will be described hereinafter.

Although these patterns are formed by etching, the patterns can be formed by plating after a metallic coating resist is deposited on both sides of the substrate.

Figure 8:
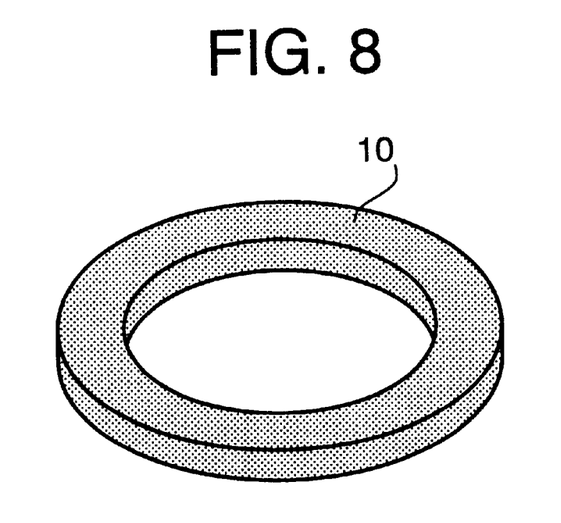
FIG. 8 is a perspective view showing a core.

FIG. 8 shows an annular member 10 made of magnetic material such as a magnetic core to be engaged with the annular grooves 9 of the first and second insulating substrates 2a and 2b. The annular core 10 is made of ferrite, samarium cobalt, permalloy or silicon steel and has a rectangular shape in section formed by cutting or molding. In joining, the core 10 is mounted in the groove 9 of either of first and second substrates 2a and 2b, and adhered thereto by adhesive.

As shown in FIG. 7, each of the first and second substrates 2a and 2b has an engaging portion 11 provided on the joining face. An adhesive 12 (FIG. 9) of a paste type or a sheet type is applied to the engaging portion 11 of either of first and second substrates 2a and 2b. Then, the joining faces of the first and second substrates 2a and 2b are faced to each other, and positioned, and joined to each other by adhesion or thermal pressure.

Figure 9:
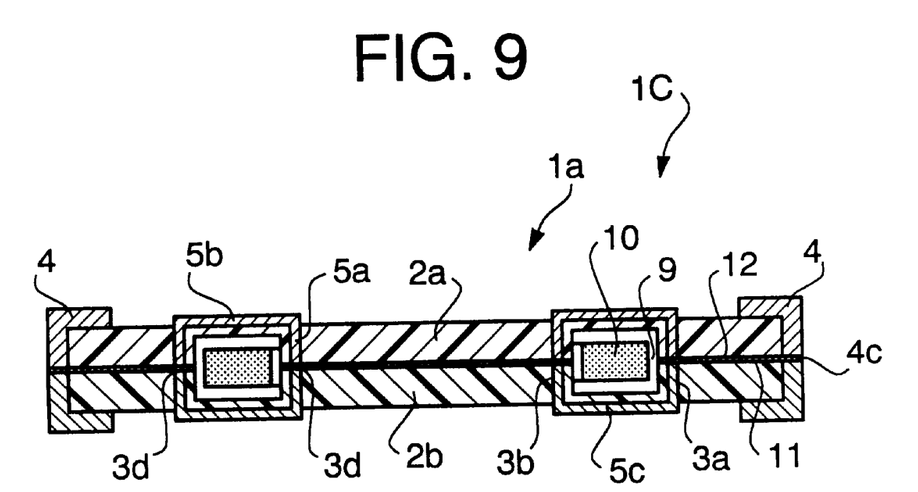
FIG. 9 is a sectional view showing a surface mount coil.

Referring to FIG. 9, a junction unit 1C of joined substrates is further plated with copper. The copper enters each through hole 3e (FIG. 6) and the gap between the terminal electrodes 4, thereby electrically connecting connecting portions 3d of the corresponding through holes, and connecting portions 4c of the corresponding electrodes, respectively. Thus, all radial connections 5b are serially connected to spirally wind the core 10, thereby forming a toroidal coil 1a from a starting pattern 4a to an end pattern 4b.

In order to enhance the magnetic effect of the toroidal coil, it is preferable to dispose the core 10 as close as possible to the inner peripheral wall of the groove 9. Therefore, it is desirable to form the core such a size as to be so positioned. Furthermore, the annular core 10 is variously formed other than the rectangular sectional shape.

In the embodiment, the coil 1a is used as a choke coil. In the case that the coil is used as a transformer, the coil around the core is divided into two parts, namely a primary coil and a secondary coil. If necessary, taps may be provided on each coil.

Figure 2:
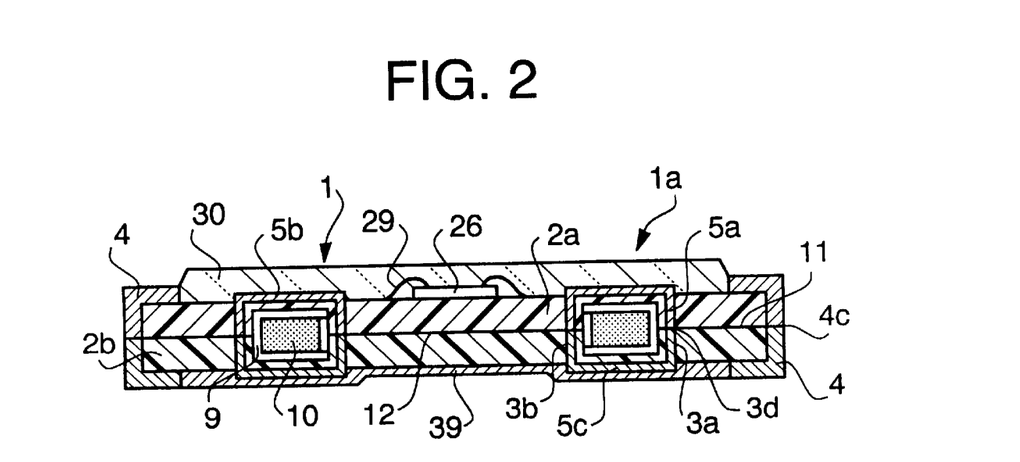
FIG. 2 is a sectional view of the modular surface mount circuit device taken along a line I—I of FIG. 1.

As shown in FIGS. 1 and 2, the voltage step-up IC 26 is mounted on an inside area of the coil 1a at the upper side of the combined unit and connected to the die pattern by die bonding. A power supply terminal of the IC 26 is connected to the connecting pattern by bonding wires 29. Thereafter, a capacitor 28 is mounted on the upper side of the combined unit to the outside of the coil 1a, and secured thereto by silver or soldering paste. The capacitor 28 is connected to the IC 26. In order to shield and protect the IC 26 and the capacitor 28, the upper side of the combined unit is coated with a sealing resin 30 of thermoplastic resin by transfer molding. Thus, the modular surface mount circuit device 1 for driving the EL cell is formed.

The manufacturing method of the modular surface mount circuit device 1 will be described with reference to FIGS. 10 to 12.

Figure 10:
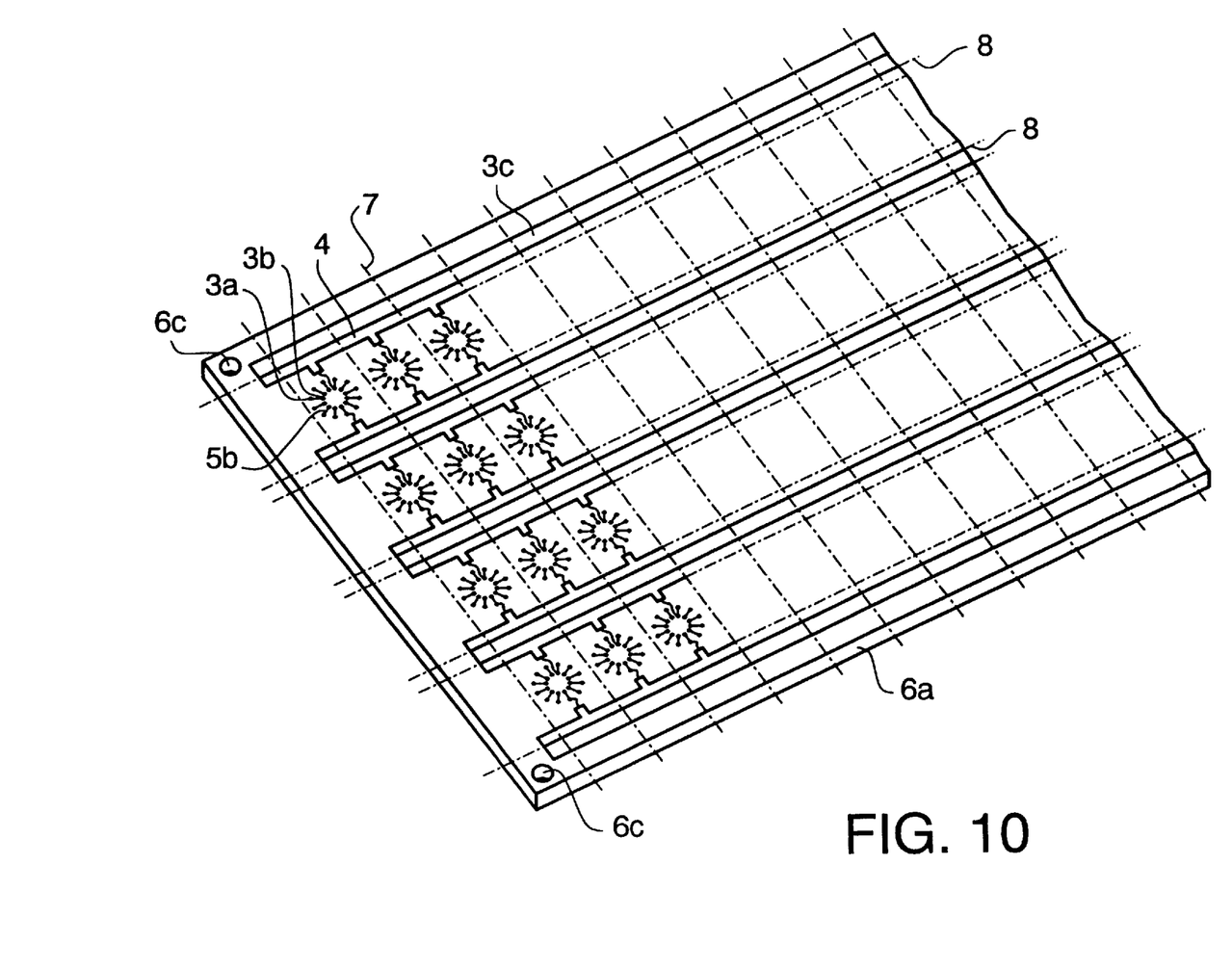
FIG. 10 is a partial perspective view showing a planar first insulating substrate for explaining steps in a manufacturing process of the modular surface mount circuit device.
Figure 11:
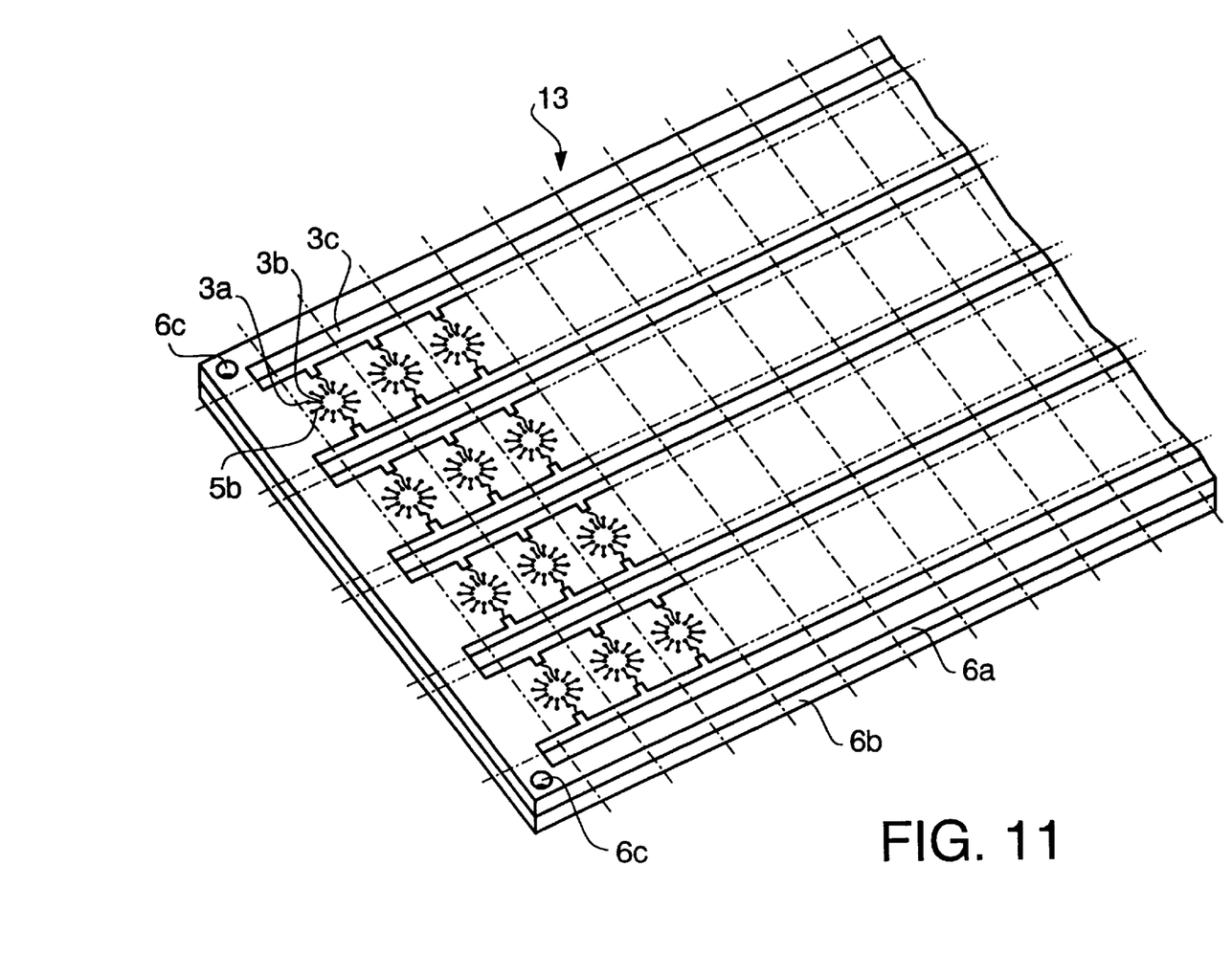
FIG. 11 is a partial perspective view showing a unit of planar first and second insulating substrates for explaining further steps in the manufacturing process.

Referring to FIG. 10, in order to mass produce the modular circuit devices 1, a first insulating substrate 6a is in the form of panel made of polycarbonate (PCB) or ceramic substrate. The first insulating planar substrate 6a is partitioned into sections by cut lines 7 and 8, and has positioning guide holes 6c formed on the opposite sides.

First, on a joining face of the first planar substrate 6a, the annular groove 9 is formed in the central portion of each section. A plurality of through holes 3a and 3b are formed around the groove 9 (FIGS. 6 and 9) along outer and inner peripheries thereof. An elongated through hole 3c is formed along each of the cut lines 8. These through holes 3a, 3b and 3c are formed by working process such as a press, a drill or a cutter.

In a first plating process, the entire surface of the first insulating planar substrate 6a, including through holes 3a, 3b, and 3c is cleaned. Then, the outer surface of the planar substrate 6a, including inner walls of the through holes 3a, 3b and 3c is plated with copper by electroless plating and electrolyte plating.

In an etching process, a metallic coating resist is laminated on the planar substrate 6a. After the resist is exposed and developed, a pattern mask is formed. By pattern etching, electrodes 4 each having L-shape in section are formed on an outer surface of the planar substrate 6a along the opposite peripheries of each of the elongated through holes 3c. Furthermore, the copper cylindrical and radial connections 5a and 5b are formed as connecting patterns of the through holes 3a and 3b.

Furthermore, on the outer surface of the substrate, the die pattern for securing the IC 26, the connecting electrode connected to the power source terminal of the IC 26, and the connecting pattern for connecting the capacitor 28 are formed in each section. Thus, the first insulating planar substrate 6a having a plurality of conductive patterns is formed.

In the aforementioned processes, the patterns are formed by plating process and subsequent etching process. Alternatively, it is possible to form the patterns by plating process after the metallic coating resist is deposited on both sides of the planar substrate.

A second insulating substrate 6b (FIG. 11) in the form of panel is manufactured in the same manner as the first insulating planar substrate 6a, thereby providing with the annular grooves, plated through holes, electrodes and copper foil patterns.

Processes for mounting the annular core 10 in the groove 9 and adhering the first and second insulating planar substrates 6a and 6b will be described with reference to FIG. 11.

In a core mounting process, the adhesive 12 (FIG. 9) of epoxy or silicon of paste type is printed on or applied to the engaging portion 11 of either of first and second planar substrates 6a and 6b by masking. Alternatively, the adhesive 12 of sheet type is applied to the engaging portion. Then, the core 10 is mounted in each groove of either of first and second planar substrates 6a and 6b and engaged therewith by adhesive.

In an adhesion process, the joining faces of the first and second planar substrates 6a and 6b are faced to each other, and the corresponding annular grooves having the core, the patterns of the corresponding through holes 3a, the patterns of the corresponding through holes 3b, and the patterns of the corresponding electrodes 4 of each section are positioned by the guide holes 6c. Thereafter, the corresponding engaging portions 11 are adhered to each other through the adhesive 12 by adhesion or thermal pressure. Thus, an integral unit 13 of adhered first and second planar substrates 6a and 6b is formed.

The positioning of the substrates is performed in accordance with guide holes 6c with accuracy by using a jig (not shown).

The mounting process and the adhesion process may take place in an inverse order.

Next, a second plating process is performed. The integral unit 13 is further plated with copper. Thus, the connecting portions 3d (FIG. 7) of the cylindrical connections 5a of the corresponding through holes 3a and the corresponding through holes 3b, and the connecting portions 4c of the electrodes 4 are connected to each other for electrical connection. Thus, in each section, the corresponding copper radial connections 5b connected to the cylindrical connections 5a of the through holes 3a and 3b are provided around the annular core for spirally winding the core, thereby forming the toroidal coil 1a. Each coil 1a forms the coil in a series of turn from the starting pattern to the end pattern.

If the coil pattern changes to the pattern of a plurality of coils, a transformer is formed.

Figures 12A, 12B:
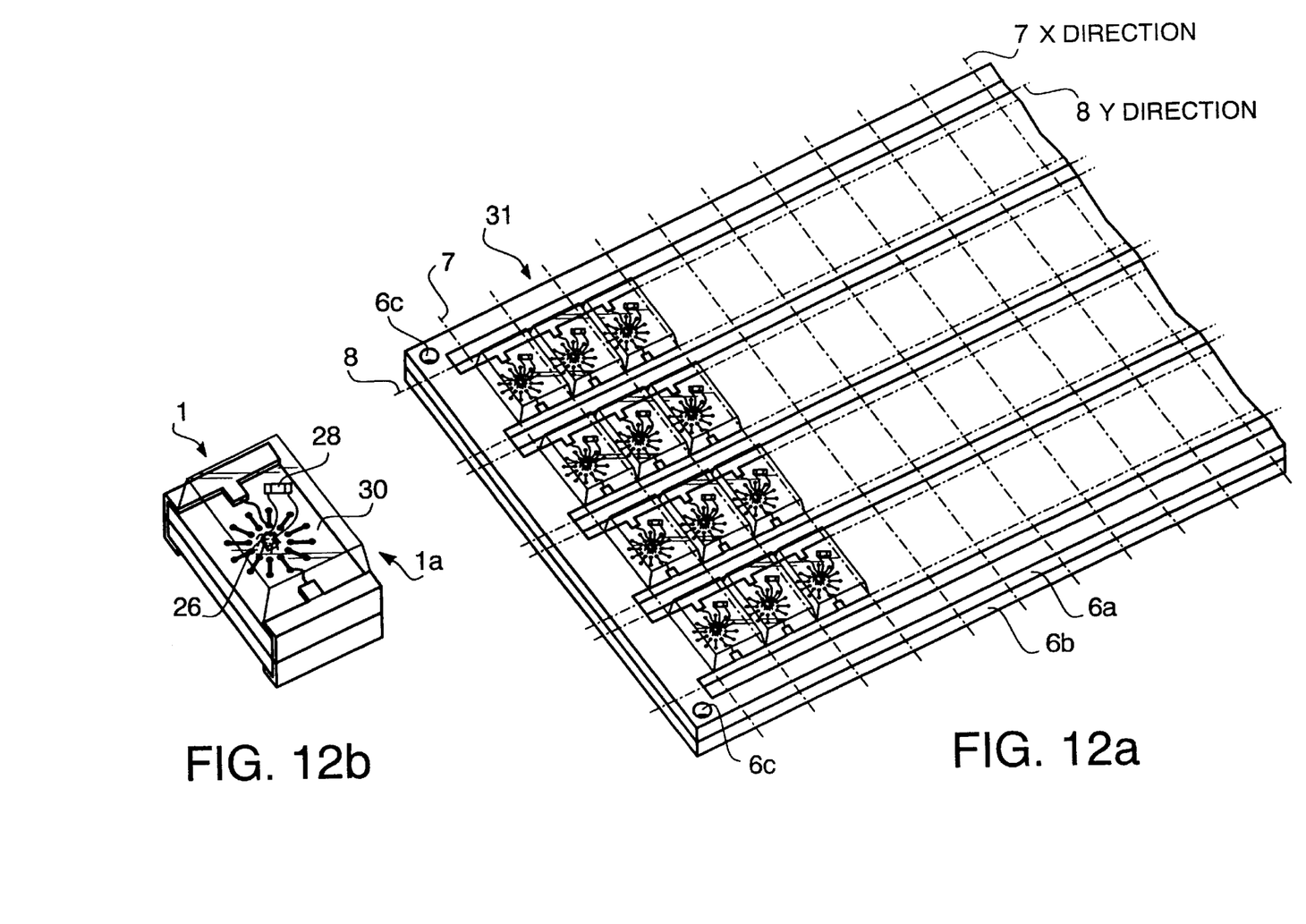
FIG. 12a is a partial perspective view showing a modular surface mount circuit device unit for explaining a dicing process in the manufacturing process.
FIG. 12b is a perspective view showing a unit of a circuit device.

Referring to FIGS. 12a and 12b, in a mounting process, the voltage step-up ICs 26 are mounted on inside areas of the coils 1a at the upper side of the integral unit 13 and connected to the die patterns by die bonding, and further connected to the connecting patterns by bonding wires 29 (FIG. 2). The capacitors 28 are secured to the upper side of the integral unit 13 by silver or soldering paste and connected to the ICs 26. In order to shield and protect the IC 26 and the capacitor 28 in each section, the sealing resin 30 of thermoplastic resin is deposited on the upper side by transfer molding. Thus, a modular circuit device aggregation 31 having a plurality of modular surface mount circuit devices 1 is formed.

In place of the thermoplastic resin, sealing resin of thermosetting resin may be used.

As shown in FIG. 12a, in a dicing process, the aggregation 31 is set to a jig (not shown) by using guide holes 6c. The aggregation 31 is sawed in an X direction along the cut line 7 into strips. Thereafter, the strips are cut in a Y direction along the cut line 8 at a right angle to the X direction. Thus, the aggregation 31 is divided into individual modular circuit devices 1.

In order to insulate the radial connections 5b exposed on the back side of the integral unit 13, a resist layer may be deposited before cutting operation.

Figure 13:
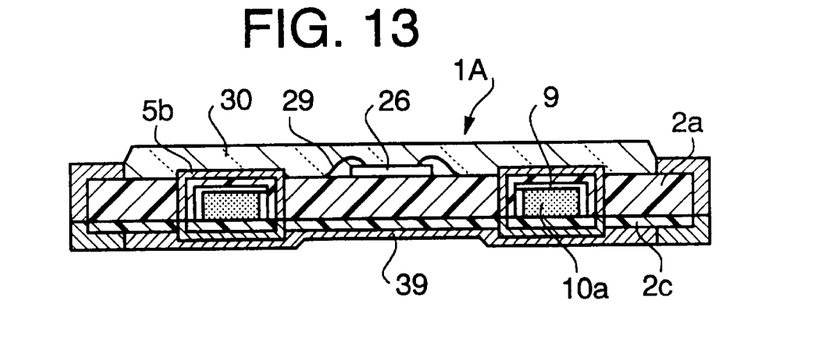
FIG. 13 is a sectional view showing a second embodiment of the modular surface mount circuit device of the present invention.

FIG. 13 shows a second embodiment of the modular surface mount circuit device for the EL cell driving circuit.

A modular surface mount circuit device 1A comprises a first insulating substrate 2a made of PCB or ceramic, and a second insulating substrate 2c made of polyimide film. An annular core 10a is mounted in the annular groove 9 formed on the first substrate 2a. The annular groove is not formed on the second substrate 2c. A resist layer 39 is deposited on a back side of the modular circuit device 1A.

Other structures are the same as those of the first embodiment, and same parts thereof are identified with the same reference numerals as FIG. 2, and descriptions thereof are omitted.

The modular circuit device 1A is manufactured in the same manner as the first embodiment.

In the embodiment, the thickness of the modular circuit device is reduced.

Figure 14:
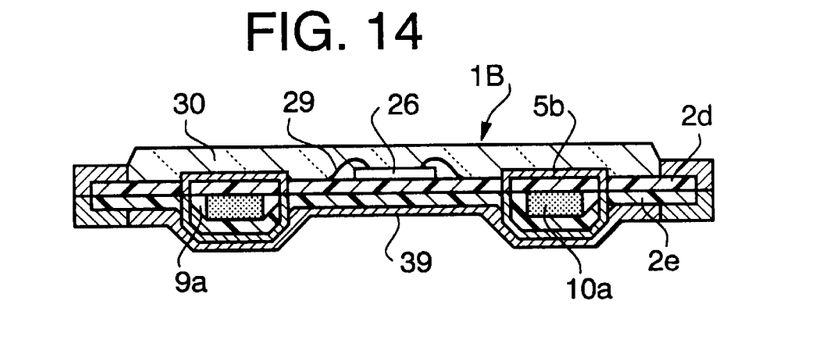
FIG. 14 is a sectional view showing a third embodiment of the present invention.

FIG. 14 shows a third embodiment of the modular surface mount circuit device for the EL cell driving circuit.

A modular surface mount circuit device 1B comprises first and second insulating substrates 2d and 2e made of polyimide films. The second insulating substrate 2e has an annular recessed groove 9a for mounting the core 10a.

The modular circuit device 1B is manufactured in the same manner as the first embodiment.

In the embodiment, the thickness of the modular circuit device is further reduced.

In the aforementioned embodiments, the voltage step-up IC 26 is mounted on the first insulating substrate 2a by wire bonding. Alternatively, in order to improve reliability and productivity, and to achieve the miniaturization and high density of the package, a bear chip is directly mounted on the substrate in a face down by flip chip bonding.

Figure 15:
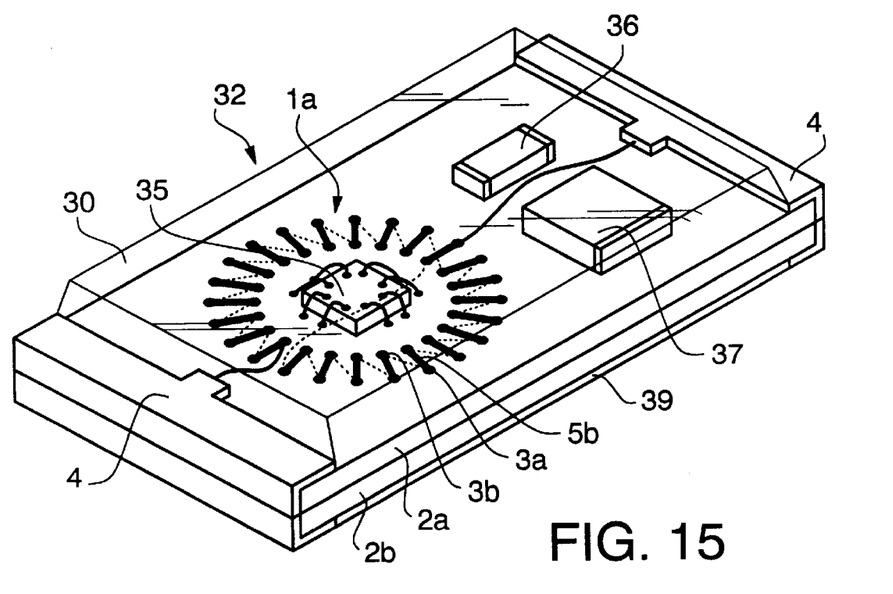
FIG. 15 is a perspective view showing a fourth embodiment of the present invention.

FIG. 15 shows a fourth embodiment of the modular surface mount circuit device for an IC of a dc-to-dc converter. The modular circuit device for the dc-to-dc converter is manufactured approximately in the same manner as that for the EL cell driving circuit.

A modular surface mount circuit device 32 for the dc-to-dc converter comprises an IC chip 35, and electronic elements such as a diode 36 and a capacitor 37.

Structures which are the same as those of the first embodiment are identified with the same reference numerals as FIG. 1, and descriptions thereof are omitted.

In the modular circuit device 32, first and second insulating substrates 2a and 2b are formed to be slightly large in size compared with those in the previous embodiment. The IC chip 35 is mounted on the inside area of the coil 1a at the upper side of the first substrate 2a. The diode 36 and the capacitor 37 are mounted on the upper side on a space outside the coil 1a. The resist layer 39 is deposited on the back side of the joined substrate unit.

A modular circuit device having additional elements may be formed in the same manner.

If the IC chip 35 is complicated in structure, which causes the IC chip to be to increased in size, the IC chip 35 is also mounted on the space outside the coil 1a.

Alternatively, if either of the first and second insulating substrates has a recess, and the electronic elements such as diode 36 and capacitor 37 including IC chip 35 are mounted therein, the thickness of the modular circuit device may be regulated. In the recess, a circuit pattern is provided.

Figure 16:
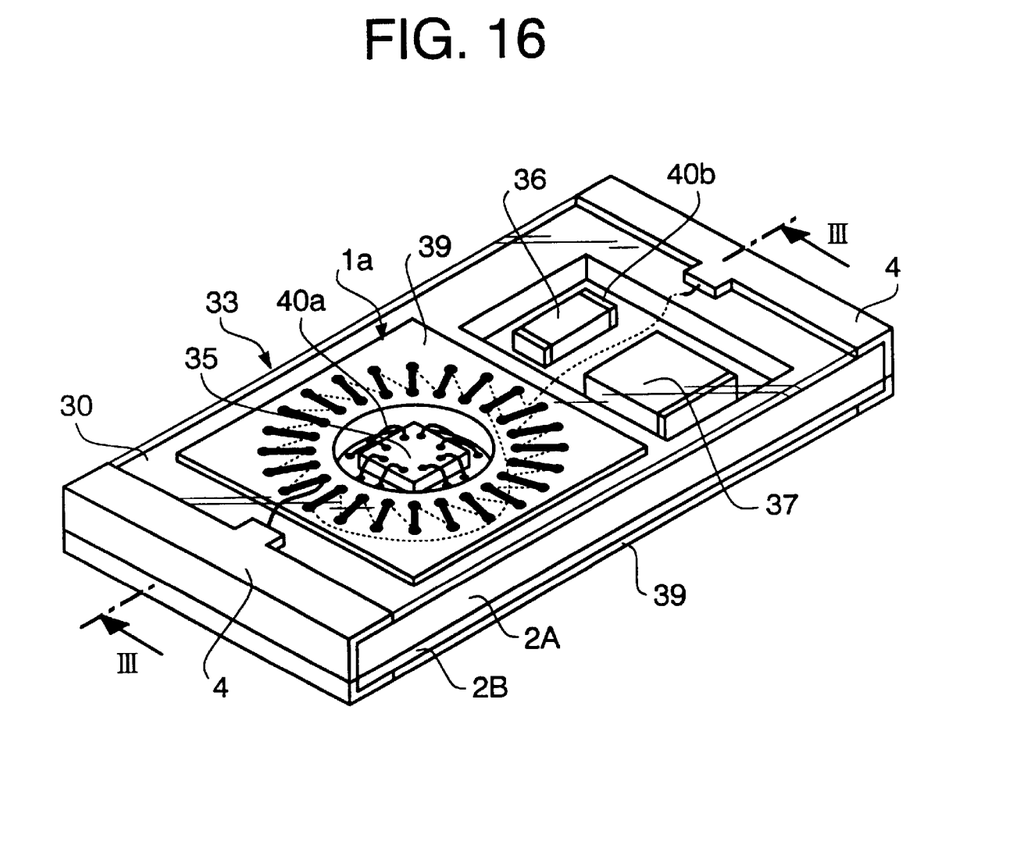
FIG. 16 is a perspective view showing a fifth embodiment of the present invention.
Figure 17:
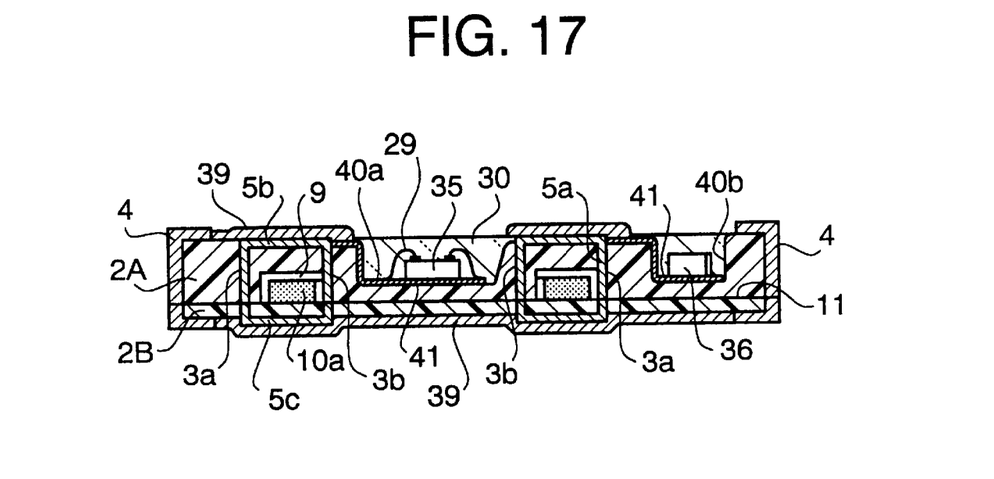
FIG. 17 is a sectional view of the fifth embodiment taken along a line III—III of FIG. 16.

FIGS. 16 and 17 show a fifth embodiment of the present invention in which the aforementioned circuit device is concretely shown.

A modular surface mount circuit device 33 comprises a first insulating substrate 2A having a vertical wiring structure and a second insulating substrate 2B made of polyimide film.

Structures which are the same as those of the fourth embodiment are identified with the same reference numerals as FIG. 15, and descriptions thereof are omitted.

The first insulating substrate 2A has a circular recess 40a formed on the inside area of the coil 1a and a rectangular recess 40b formed outside the coil 1a on the upper side thereof. In the recesses 40a and 40b, circuit patterns 41 are formed, respectively. Each recess is formed to have a depth to fully mount the electronic elements without exposing a part thereof.

The IC chip 35 is mounted in the recess 40a and connected to the circuit pattern 41 by bonding wires 29. The diode 36 and capacitor 37 are mounted in the recess 40b and connected to the circuit pattern 41 by bonding wires. Then, the recesses 40a and 40b are sealed with the sealing resin 30 for protecting these electronic elements. The resist layer 39 is deposited on the radial connections 5b of the first substrate 2A and the second substrate 2B.

In place of the vertical wiring substrate for the first insulating substrate 2A, the substrate of PCB or ceramic is employed.

Thus, in the embodiment, the unit of joined substrates coated with sealing resin 30 and resist layer 39 is formed without exceeding the height of the opposite electrodes 4. Consequently, the thickness of the modular circuit device can be further reduced.

As aforementioned, the coil 1a is used as a choke coil. If the coil is used as a transformer, the coil around the core is divided into two parts, namely a primary coil and a secondary coil. If necessary, taps may be provided.

In accordance with the present invention, in the EL cell driving circuit, the size of the IC chip is about between 1.5 mm and 2 mm square, and the size of the capacitor is 1.0 mm×0.5 mm. Thus, the modular circuit device is formed less than 8.5 mm square and less than 1 mm in thickness.

Similarly, in the dc-to-dc converter, the size of the modular circuit device is 8.5 mm×15 mm×1 mm.

In accordance with the present invention, since at least the toroidal coil is packaged, the device can be reduced in size. Furthermore, since the coil is spirally wound, the number of turns can be increased.

While the invention has been described in conjunction with preferred specific embodiment thereof, it will be understood that this description is intended to illustrate and not limit the scope of the invention, which is defined by the following claims.

What is claimed is:

1. A modular surface mount circuit device comprising:
   a junction unit including first and second electrically insulating substrates which are joined with each other at respective joining faces thereof;
   at least one of the first and second insulating substrates having an annular groove at the joining face;
   each of the first and second insulating substrates having a plurality of through holes along outer and inner peripheries of the annular groove;
   an annular member made of magnetic material mounted in the annular groove;
   a cylindrical connection formed in each of the through holes;
   a radial connection formed on an outer surface of each of the first and second insulating substrates so as to connect opposite cylindrical connections;
   a toroidal coil formed by serially connecting cylindrical connections and radial connections;
   at least one electronic part mounted on the outer surface of either of the first and second insulating substrates;
   patterns mounted on the part mounted surface for connecting the toroidal coil and the electronic part; and
   an electrically insulating material coating the toroidal coil and the electronic part.

2. The circuit device according to claim 1 wherein the annular groove is formed in the joining face of each of the insulating substrates.

3. The circuit device according to claim 1 further comprising a pair of terminal electrodes formed on opposite end portions of the junction unit, and both ends of the toroidal coil, are electrically connected to the terminal electrodes, respectively.

4. The circuit device according to claim 1 wherein the second insulating substrate is made of insulating film.

5. The circuit device according to claim 1 wherein the first and second insulating substrates are made of insulating films, and the annular groove is formed by a recessed groove formed in the second insulating substrate.

6. The circuit device according to claim 1 wherein the electronic part is mounted in a recess formed in the first insulating substrate.

7. The circuit device according to claim 1 wherein the annular member is a magnetic core.

8. The circuit device according to claim 4 wherein the first insulating substrate has a recess at a central portion in the toroidal coil, and the electronic part is mounted in the recess.

9. A method for manufacturing a plurality of modular surface mount circuit devices, the steps comprising:
   providing first and second electrically insulating planar substrates, each having an outer surface and a joining face, and having a plurality of units defined by a plurality of crossing lines, at least one of the substrates having an annular groove in each of the units arranged in matrix on the joining face, and each of the substrates having a plurality of through holes formed along outer and inner peripheries of each of the annular grooves;
   forming a cylindrical connection in each of the through holes of each of the substrates;
   forming a radial connection on the outer surface of each of the substrates so as to connect opposite cylindrical connections;
   mounting an annular member made of magnetic material in each of the annular grooves;
   joining the first and second substrates at the joining faces;
   electrically and serially connecting the cylindrical connections and radial connections at each of the units so as to form a toroidal coil;
   mounting at least one electronic part on the outer surface of either of the first and second substrates at each unit;
   electrically connecting the toroidal coil and the electronic part with each other at each unit;
   coating the toroidal coil and the electronic part with an electrically insulating material; and
   cutting the first and second substrates along the crossing lines to provide an individual circuit device.

10. The method according to claim 9 further comprising each of the first and second substrates has a plurality of elongated through holes formed along parallel lines between arrays of units, and forming a terminal electrode along each of the elongated through holes.

11. The method according to claim 10 wherein opposite terminal electrodes are connected to both ends of the toroidal coil.

* * * * *